United States Patent
Chiang

(10) Patent No.: US 8,471,157 B2
(45) Date of Patent: Jun. 25, 2013

(54) EMI SHIELDING DEVICE AND CONTAINER DATA CENTER USING THE SAME

(75) Inventor: Wen-Kai Chiang, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 320 days.

(21) Appl. No.: 12/981,437

(22) Filed: Dec. 29, 2010

(65) Prior Publication Data

US 2012/0152609 A1   Jun. 21, 2012

(30) Foreign Application Priority Data

Dec. 15, 2010   (TW) ................................ 99143868 A

(51) Int. Cl.
*H02G 3/18*   (2006.01)

(52) U.S. Cl.
USPC .......................................... 174/362; 174/650

(58) Field of Classification Search
USPC .................. 174/377, 382, 362, 650
See application file for complete search history.

(56) References Cited

U.S. PATENT DOCUMENTS

| | | | | | |
|---|---|---|---|---|---|
| 3,830,954 | A | * | 8/1974 | Caudill | 174/362 |
| 4,291,195 | A | * | 9/1981 | Blomqvist et al. | 174/505 |
| 4,358,632 | A | * | 11/1982 | Buch | 174/360 |
| 4,656,313 | A | * | 4/1987 | Moore et al. | 174/362 |
| 4,677,253 | A | * | 6/1987 | Blomqvist | 174/362 |
| 5,493,068 | A | * | 2/1996 | Klein et al. | 174/362 |
| 6,375,361 | B1 | * | 4/2002 | Falco et al. | 385/53 |
| 8,096,562 | B2 | * | 1/2012 | Johansson et al. | 277/630 |

* cited by examiner

Primary Examiner — Hung Ngo
(74) Attorney, Agent, or Firm — Altis Law Group, Inc.

(57) ABSTRACT

A container data center includes a container defining a wire hole therein, a cable extending through the wire hole of the container, and an EMI shielding device preventing electromagnetic radiation from entering into the container from the outside environment or leaking from the container to the outside environment through the wire hole of the container. The EMI shielding device includes a metal cylinder through which the cable extends and an effective amount of metal powder packed between the metal cylinder and the cable for shielding EMI. The metal cylinder has an end thereof inserted into the wire hole of the container and engaged with a circumferential edge of the wire hole. The disclosure further relates to an EMI shielding device.

16 Claims, 8 Drawing Sheets

EMI SHIELDING DEVICE AND CONTAINER DATA CENTER USING THE SAME

BACKGROUND

1. Technical Field

The present disclosure relates to container data centers, and particularly to a container data center having an EMI shielding device.

2. Description of Related Art

With increasing heavy use of online applications, the need for container data centers has increased rapidly. The container data centers are centralized computing facilities that include many servers, often arranged on server racks or shelves, with one rack or shelf with some servers considered a server system. In a working state, the server systems emit electromagnetic radiation. The electromagnetic radiation can leak through a wire hole through which a cable extends to the environment. At the same time, electromagnetic radiation from the environment may enter into the container data center through the same wire hole to interfere with the server systems.

What is needed, therefore, is a container data center which can overcome the above problem.

BRIEF DESCRIPTION OF THE DRAWINGS

Many aspects of the present embodiments can be better understood with reference to the following drawings. The components in the drawings are not necessarily drawn to scale, the emphasis instead placed upon clearly illustrating the principles of the present embodiments. Moreover, in the drawings, like reference numerals designate corresponding parts throughout the various views.

DETAILED DESCRIPTION

Figure 1:
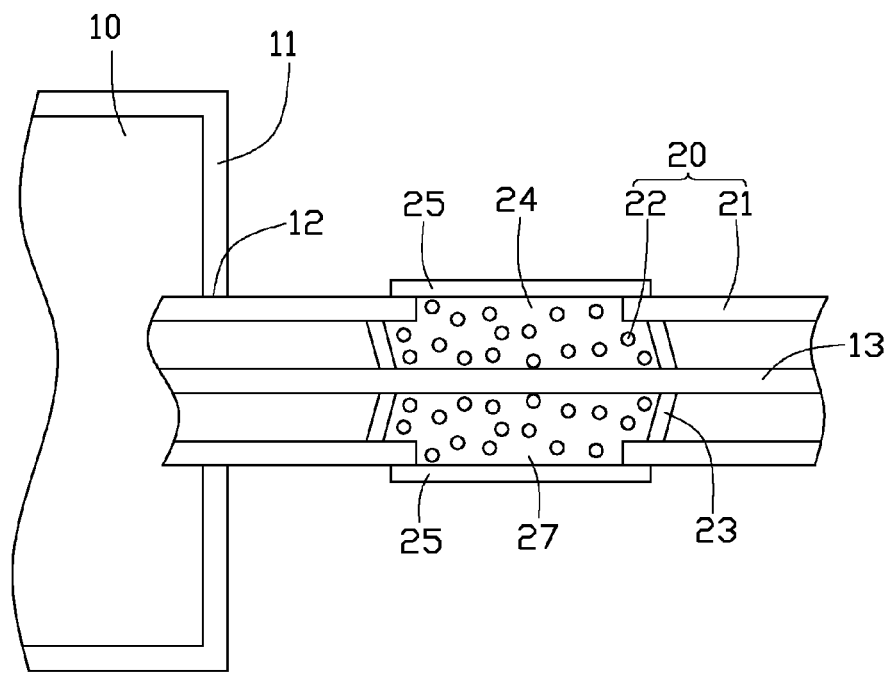
FIG. 1 is a partial, schematic view of a container data center in accordance with a first embodiment of the disclosure, wherein the container data center comprises an EMI shielding device.

Referring to FIG. 1, a container data center 100 in accordance with a first embodiment of the disclosure is illustrated. The container data center 100 comprises a container 10 and an EMI (electromagnetic interference) shielding device 20 mounted on the container 10. In this embodiment, the EMI shielding device 20 are located outside of the container 10. In other embodiments, the EMI shielding device 20 may be mounted inside of the container 10.

The container 10 includes an outer wall 11, a wire hole 12 defined in the outer wall 11, and a cable 13 extending through the wire hole 12. The EMI shielding device 20 is applied for protecting against EMI between the container 10 and environment through the wire hole 12. The EMI shielding device 20 includes a metal cylinder 21 through which the cable 13 extends and an amount of metal powder 22 packed in a gap between the metal cylinder 21 and the cable 13, enough to shield EMI. The metal cylinder 21 has an end inserted into the wire hole 12 and engaged with a circumferential edge of the wire hole 12. The metal cylinder 21 has an elongated configuration.

The metal cylinder 21 includes two spaced blockers 23 therein along a lengthways direction to block off the metal powder 22. Each of the blockers 23 has a circumferential edge firmly attached to an inner surface of the metal cylinder 21. Each blocker 23 defines a through hole (not labeled) in a central portion thereof. The cable 13 extends through the through holes of the blockers 23. The metal powder 22 is located between the blockers 23. Each blocker 23 is a sheet formed by an elastic material such as rubber or plastic.

The metal cylinder 21 defines an inlet 24 in a top portion and an outlet 27 in a bottom portion. The inlet 24 of the metal cylinder 21 is for adding the metal powder 22 into the metal cylinder 21, and the outlet 27 is for cleaning up the metal powder 22 in the metal cylinder 21. The metal cylinder 21 includes two metal covers 25 corresponding to the inlet 24 and the outlet 27 of the metal cylinder 21. The inlet 24 and the outlet 27 are defined between two blockers 23. The metal covers 25 each have an end movably connected with the metal cylinder 21. The metal covers 25 cover the inlet 24 and the outlet 27 of the metal cylinder 21 according to actual need.

Figure 2:
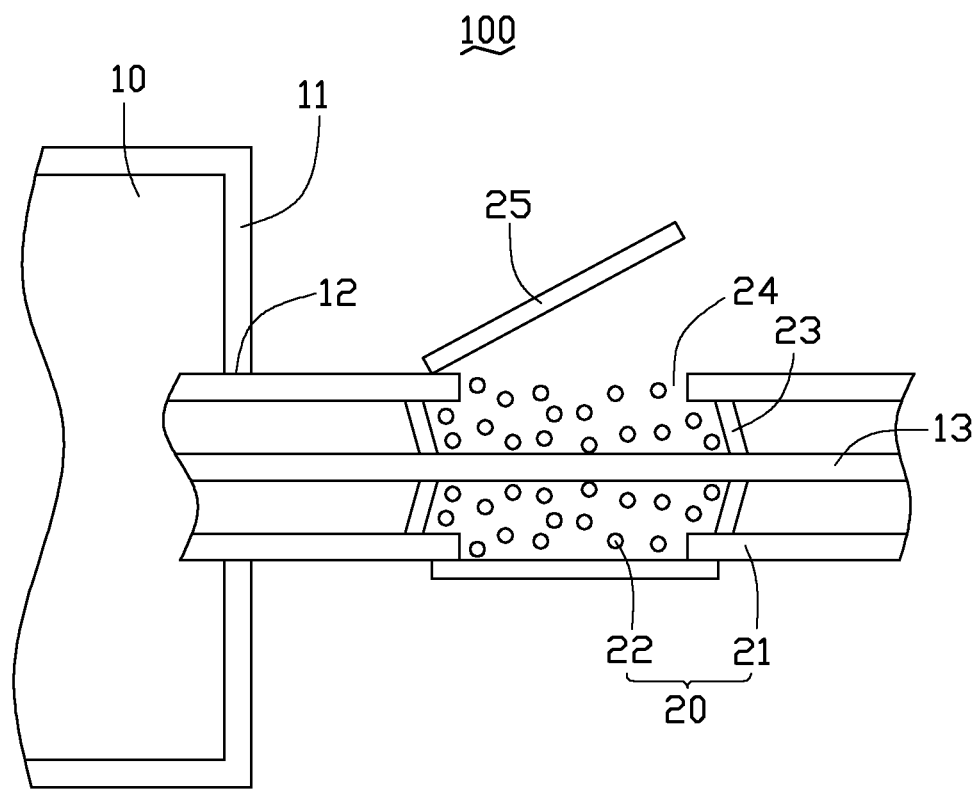
FIGS. 2-3 are schematic views of a method of using the EMI shielding device of the container data center of FIG. 1.

Referring also to FIG. 2, in use, opening the metal cover 25 at the inlet 24 of the metal cylinder 21, and filling the metal powder 22 in the metal cylinder 21 until it is packed in the gap between the metal cylinder 21 and the cable 13, enough to shield EMI. After that, closing the metal cover 25 at the inlet 24, whereby the EMI shielding device 20 isolates the electromagnetic radiation at the internal and the external parts of the container 10.

Figure 3:
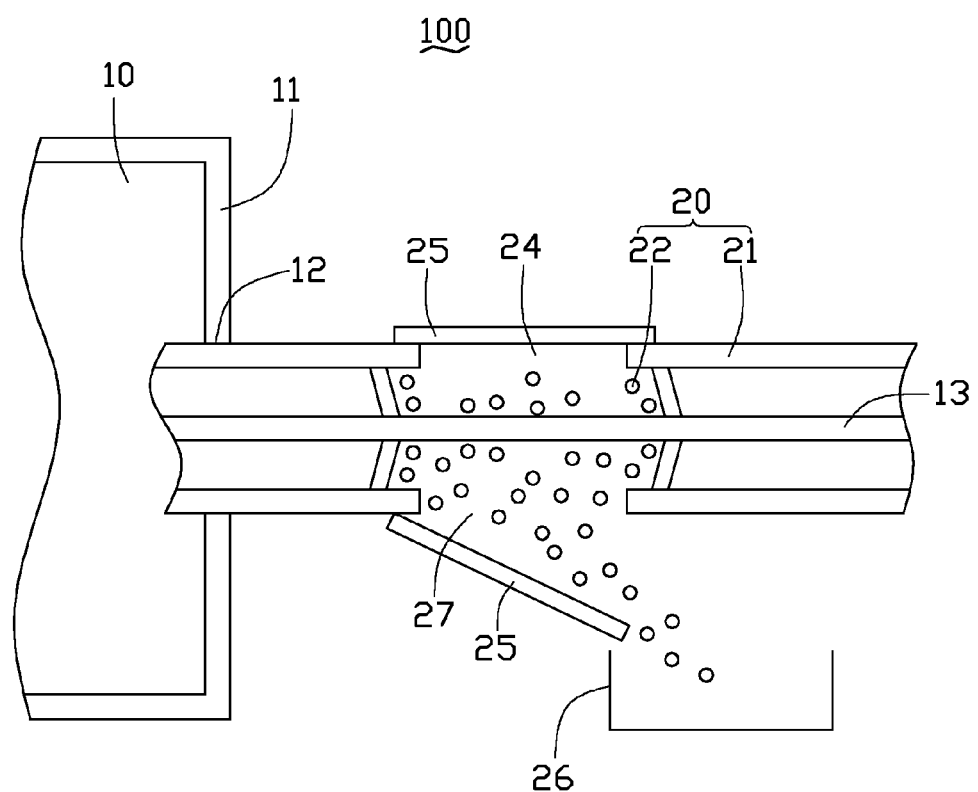

Referring also to FIG. 3, when the cable 13 needs to be rearranged, opening the metal cover 25 at the outlet 27 of the metal cylinder 21, the metal powder 22 flows out from the outlet 27 of the metal cylinder 21 into a metal powder receiver 26, whereby the metal powder 22 can be reused.

Figure 4:
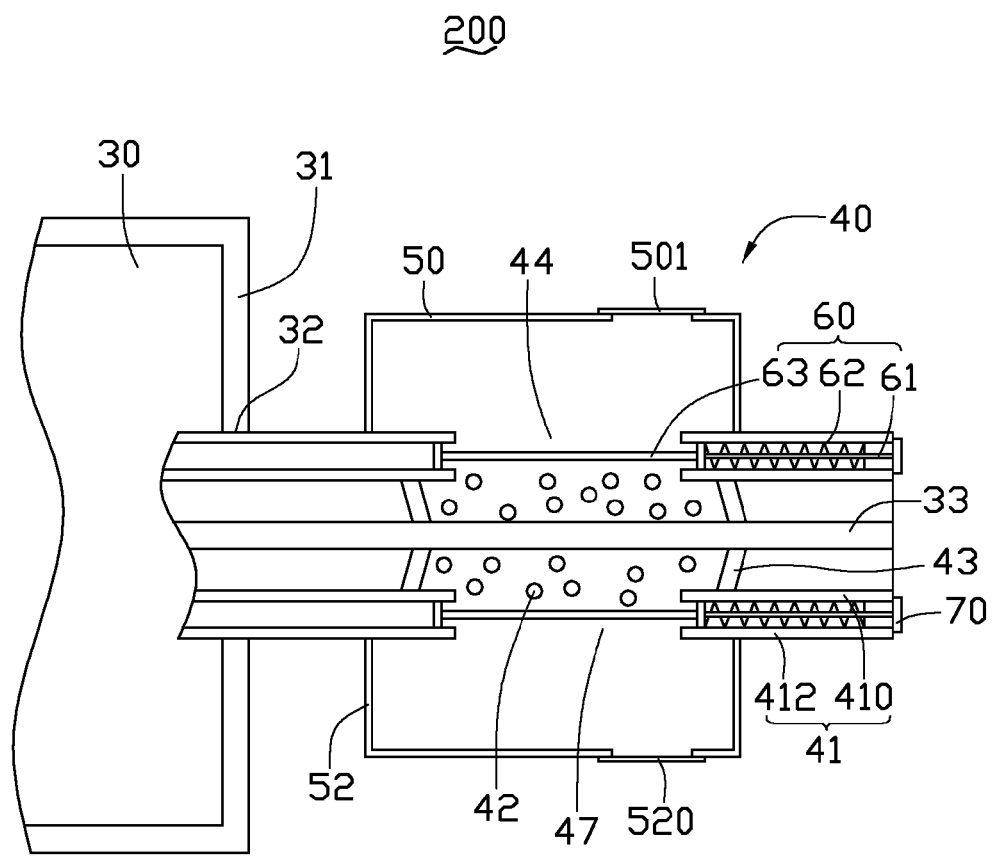
FIG. 4 is a partial, schematic view of a container data center in accordance with a second embodiment of the disclosure, wherein the container data center comprises an EMI shielding device.

Referring to FIG. 4, a container data center 200 in accordance with a second embodiment of the disclosure is illustrated. The container data center 200 includes a container 30 and an EMI shielding device 40 mounted on the container 30. In this embodiment, the EMI shielding device 40 is located outside of the container 30. In other embodiments, the EMI shielding device 40 may be mounted inside the container 30.

The container 30 includes an outer wall 31, a wire hole 32 defined in the outer wall 31, and a cable 33 extending through the wire hole 32. The EMI shielding device 40 is applied for protecting against EMI between the container 30 and environment through the wire hole 32. The EMI shielding device 40 includes a metal cylinder 41 through which the cable 33 extends, a first box 50 and a second box 52 mounted on an external portion of the metal cylinder 41, a first switching assembly 60 and a second switching assembly 70 in the metal cylinder 41, and metal powder 42 packed in a gap between the metal cylinder 41 and the cable 33, enough to shield EMI.

The metal cylinder 41 includes an inner tube 410 and an outer tube 412 coiling around the inner tube 410. The inner tube 410 is spaced from the outer tube 412. The outer tube 412 has an end inserted into the wire hole 32 of the container 30 and engaged with a circumferential edge of the wire hole 32. The inner tube 410 and the outer tube 412 each have an elongated configuration. The metal powder 42 is packed in a gap between the inner tube 410 and the cable 33.

The metal cylinder 41 includes two spaced blockers 43 therein along a lengthways direction blocking the metal powder 42. Each of the blockers 43 has a circumferential edge firmly attached to an inner surface of the inner tube 410 of the metal cylinder 41. Each blocker 43 defines a through hole (not labeled) in a central portion thereof. The cable 33 extends through the through holes of the blockers 43. The metal powder 42 are located between the blockers 43. Each blocker 43 is a sheet formed by an elastic material such as rubber or plastic.

The metal cylinder 41 defines an inlet 44 in a top portion and an outlet 47 in a bottom portion. The inlet 44 and the outlet 47 each communicate with the inner tube 410. The inlet 44 and the outlet 47 are located between the blockers 43.

The first box 50 is mounted on the top portion of the metal cylinder 41 and covers the inlet 44. The inlet 44 communicates with the first box 50. The first box 50 defines a first hinged door 501 at a top portion thereof. The second box 52 is mounted on the bottom portion of the metal cylinder 41 and covers the outlet 47. The outlet 47 communicates with the second box 52. The second box 52 defines a second hinged door 520 at a bottom portion. The first and second boxes 50, 52 each are formed by metal materials.

The first switching assembly 60 and the second switching assembly 70 each are located between the inner tube 410 and the outer tube 412 of the metal cylinder 41. The first switching assembly 60 is adjacent to the top portion of the metal cylinder 41. The second switching assembly 70 is adjacent to the bottom portion of the metal cylinder 41.

The first switching assembly 60 includes a handle 61, an elastic member 62, and a metal plate 63. The handle 61 has an end extending beyond an outer end of the metal cylinder 41, and has an opposite end inserted into the metal cylinder 41 and connected with an end of the metal plate 63. An opposite end of the metal plate 63 steps across the inlet 44. The elastic member 62 has an end secured to the outer end of the metal cylinder 41 and has an opposite end connected with a connection between the handle 61 and the metal plate 63. The elastic member 62 is compressed between the outer end of the metal cylinder 41 and the connection of the handle 61 and the metal plate 63. In this embodiment, the elastic member 62 is a spring. The second switching assembly 70 is similar to the first switching assembly 60.

Figure 5:
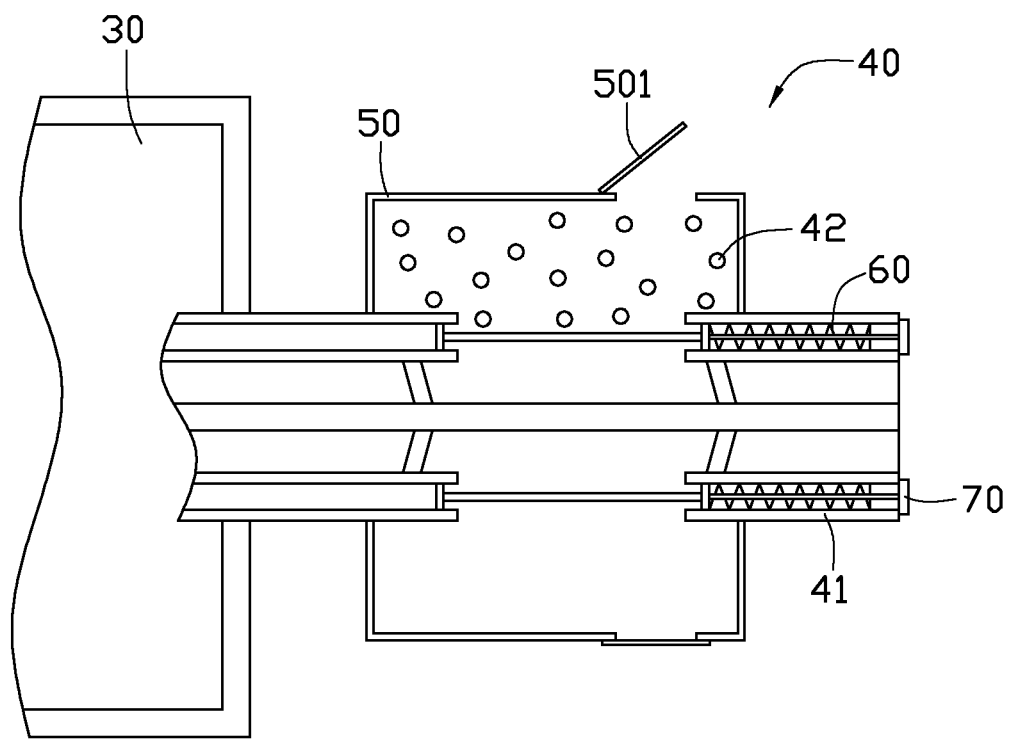
FIGS. 5-8 are schematic views of a method of using the EMI shielding device of the container data center of FIG. 4.
Figure 6:
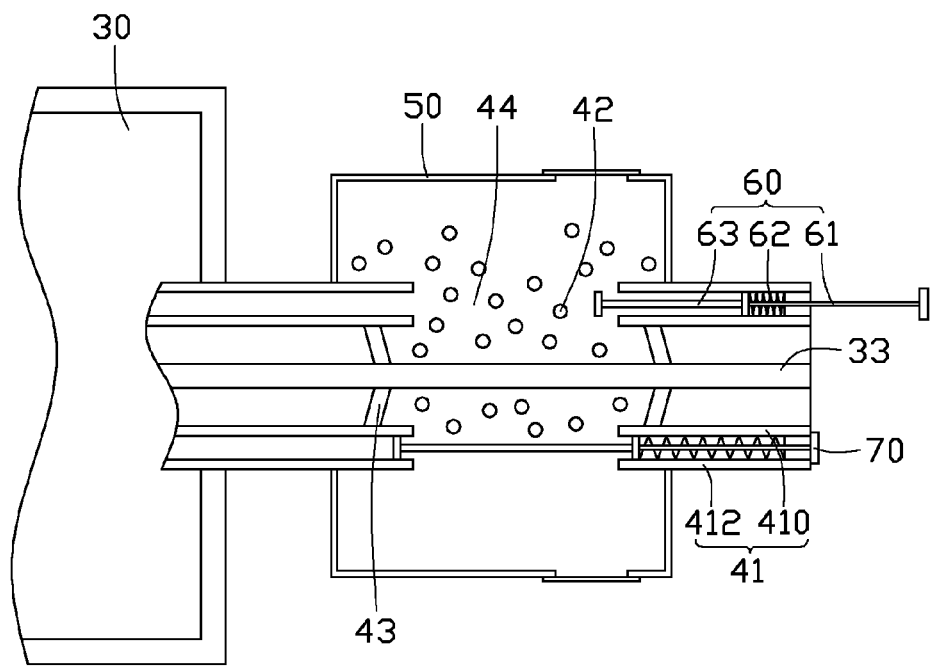

Referring to FIG. 5, in use of the EMI shielding device 40, the inlet 44 and the outlet 47 are closed by the first and second switching assemblies 60, 70, and the metal powder 42 are stored in the first box 50. Referring to FIG. 6, the handle 61 of the first switching assembly 60 is dragged outward, and the metal plate 63 is pulled away from the inlet 44 compressing the elastic member 62. The metal powder 42 in the first box 50 flow through the inlet 44 into the inner tube 410. When the metal powder 42 fills the gap between the inner tube 410 and the cable 33 with the help of the blockers 43, then, the metal plate 63 closes the inlet 44 under the elastic force of the elastic member 62, relaxing the first switching assembly 60. At the same time, the EMI shielding device 40 isolates the electromagnetic radiation at the internal and the external parts of the container 30.

Figure 7:
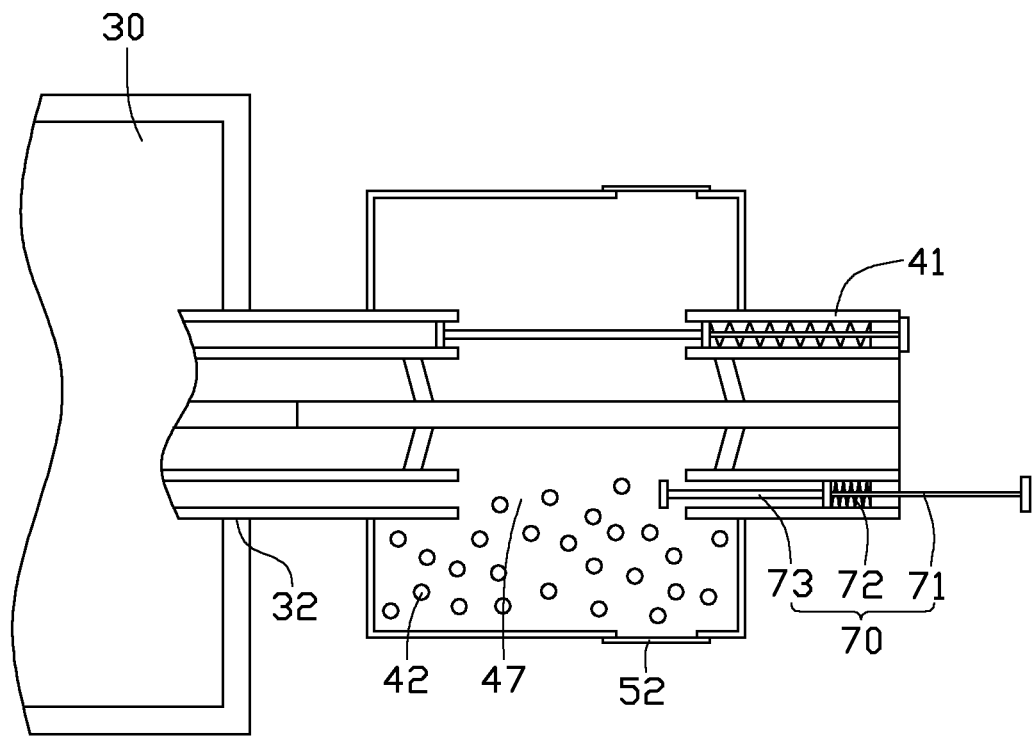
Figure 8:
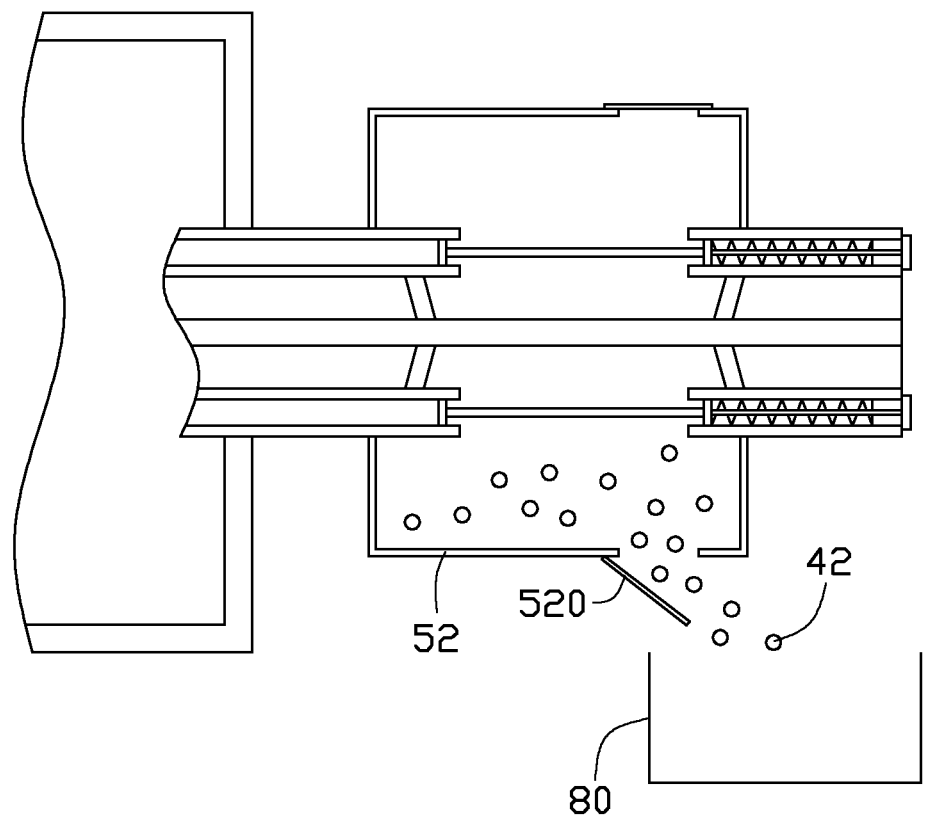

Referring also to FIGS. 7-8, when the cable 33 needs to be rearranged, the handle 71 of the second switching assembly 70 is dragged outward, and the metal plate 73 is pulled away from the outlet 47 compressing the elastic member 72. The metal powder 42 in the inner tube 410 flow through the outlet 47 into the second box 52, as viewed in FIG. 7, then, the metal plate 73 closes the outlet 47 under the elastic force of the elastic member 72, relaxing the second switching assembly 70. Finally, after opening the second hinged door 520 of the second box 52, the metal powder 42 flows into a metal powder receiver 80.

In the present disclosure, in a process of filling the metal powder 42 and removing the metal powder 42, the cooperation between the first switching assembly 60 and the first box 50 or the cooperation between the second switching assembly 70 and the second box 52 prevents cooling air in the container 30 from leaking.

In addition, the EMI shielding devices 20, 40 can prevent insects from entering into the containers 10, 30 through the wire holes 12, 32.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An EMI (electromagnetic interference) shielding device for isolating EMI via a wire hole through which a cable extends, the EMI shielding device comprising:
   a metal cylinder through which the cable extends, the metal cylinder having an end thereof inserted into the wire hole and engaged with a circumferential edge of the wire hole; and
   an effective amount of metal powder packed between the metal cylinder and the cable for shielding EMI;
   wherein the metal cylinder comprises two spaced blockers therein along a lengthways direction blocking off the metal powder, the cable extending through the blockers; and
   wherein the metal cylinder comprises an inner tube and an outer tube coiling around the inner tube, the inner tube being spaced from the outer tube, the inner tube having an end engaged with the circumferential edge of the wire hole, the blockers being arranged in the inner tube, the metal powder being packed between the inner tube and the cable.

2. The EMI shielding device of claim 1, wherein the metal cylinder defines an inlet in a top portion thereof and an outlet in a bottom portion thereof, the inlet and the outlet being defined between two blockers, the EMI shielding device further comprising two metal covers corresponding to the inlet and the outlet of the metal cylinder, the metal covers being movably connected with the metal cylinder and covering the inlet and the outlet of the metal cylinder according to actual need.

3. The EMI shielding device of claim 1, wherein the metal cylinder defines an inlet in a top portion thereof and an outlet in a bottom portion thereof, the inlet and the outlet each communicating with the inner tube.

4. The EMI shielding device of claim 3, further comprising two metal plates located between the inner tube and the outer tube, wherein the metal plates respectively correspond to the inlet and the outlet of the metal cylinder and close the inlet and the outlet according to actual need.

5. The EMI shielding device of claim 4, further comprising two handles and two elastic members, wherein the handles and the two elastic members are located between the inner tube and the outer tube.

6. The EMI shielding device of claim 5, wherein each of the handles has an end thereof abutting an opposite end of the metal cylinder distant from the end of the metal cylinder, each handle being connected with a corresponding metal plate, the elastic members being compressed between the opposite end of the metal cylinder and the connections between the handles and the corresponding metal plates, respectively.

7. The EMI shielding device of claim 4, further comprising a first box and a second box located at top and bottom portions of the outer tube of the metal cylinder, respectively, wherein the first and second boxes cover the inlet and the outlet of the metal cylinder, respectively.

8. The EMI shielding device of claim 7, wherein the first box defines a first hinged door at a top portion thereof, the second box defining a second hinged door at a bottom portion thereof, the first and second boxes being formed by metal materials.

9. A container data center comprising:
a container defining a wire hole therein;
a cable extending through the wire hole of the container; and
an EMI shielding device preventing electromagnetic radiation from entering into the container from an outside environment or leaking from the container to the outside environment through the wire hole of the container, the EMI shielding device comprising a metal cylinder through which the cable extends and an effective amount of metal powder packed between the metal cylinder and the cable for shielding EMI, the metal cylinder having an end thereof inserted into the wire hole of the container and engaged with a circumferential edge of the wire hole;
wherein the metal cylinder of the EMI shielding device comprises two spaced blockers therein along a lengthways direction blocking off the metal powder, the cable extending through the blockers; and
wherein the metal cylinder of the EMI shielding device comprises an inner tube and an outer tube coiling around the inner tube, the inner tube being spaced from the outer tube, the inner tube having an end thereof engaged with the circumferential edge of the wire hole, the blockers being arranged in the inner tube, the metal powder being packed between the inner tube and the cable.

10. The container data center of claim 9, wherein the metal cylinder of the EMI shielding device defines an inlet in a top portion thereof and an outlet in a bottom portion thereof, the inlet and the outlet being defined between two blockers, the EMI shielding device further comprising two metal covers respectively corresponding to the inlet and the outlet of the metal cylinder, the metal covers being movably connected with the metal cylinder and covering the inlet and the outlet of the metal cylinder according to actual need.

11. The container data center of claim 9, wherein the metal cylinder of the EMI shielding device defines an inlet in a top portion thereof and an outlet in a bottom portion thereof, the inlet and the outlet each communicating with the inner tube.

12. The container data center of claim 11, wherein the EMI shielding device further comprises two metal plates located between the inner tube and the outer tube, the metal plates respectively corresponding to the inlet and the outlet of the metal cylinder and closing the inlet and the outlet according to actual need.

13. The container data center of claim 12, wherein the EMI shielding device further comprises two handles and two elastic members, the handles and the two elastic members being located between the inner tube and the outer tube.

14. The container data center of claim 13, wherein each of the handles has an end thereof abutting an opposite end of the metal cylinder distant from the end of the metal cylinder, each handle being connected with a corresponding metal plate, the elastic members being compressed between the opposite end of the metal cylinder and the connections between the handles and the corresponding metal plates, respectively.

15. The container data center of claim 12, wherein the EMI shielding device further comprises a first box and a second box located at top and bottom portions of the outer tube of the metal cylinder, respectively, the first and second boxes covering the inlet and the outlet of the metal cylinder.

16. The container data center of claim 15, wherein the first box defines a first hinged door at a top portion thereof, the second box defining a second hinged door at a bottom portion thereof, the first and second boxes being formed by metal materials.

* * * * *